(12) United States Patent
Hellwig et al.

(10) Patent No.: US 12,107,026 B2
(45) Date of Patent: Oct. 1, 2024

(54) CIRCUIT ARRANGEMENT WITH A THERMAL INTERFACE

(71) Applicant: Infineon Technologies AG, Neubiberg (DE)

(72) Inventors: Raphael Hellwig, Regensburg (DE); Philip Amos, Berkshire (GB); Walter Hartner, Bad Abbach-Peissing (DE)

(73) Assignee: Infineon Technologies AG, Neubiberg (DE)

( * ) Notice: Subject to any disclaimer, the term of this patent is extended or adjusted under 35 U.S.C. 154(b) by 173 days.

(21) Appl. No.: 17/542,905

(22) Filed: Dec. 6, 2021

(65) Prior Publication Data

US 2022/0199481 A1 Jun. 23, 2022

(30) Foreign Application Priority Data

Dec. 22, 2020 (DE) .......................... 102020216456.8

(51) Int. Cl.
*H01L 23/34* (2006.01)
*H01L 23/498* (2006.01)
*H01L 23/552* (2006.01)

(52) U.S. Cl.
CPC ........ *H01L 23/34* (2013.01); *H01L 23/49816* (2013.01); *H01L 23/49822* (2013.01); *H01L 23/552* (2013.01)

(58) Field of Classification Search
None
See application file for complete search history.

(56) References Cited

U.S. PATENT DOCUMENTS

| | | | |
|---|---|---|---|
| 11,205,623 B2 * | 12/2021 | Tarui | H01L 23/3121 |
| 2007/0181997 A1 * | 8/2007 | Ahr | H01L 24/97 |
| | | | 257/E23.092 |
| 2008/0258294 A1 | 10/2008 | Tseng et al. | |
| 2021/0043544 A1 * | 2/2021 | Eid | H03H 9/02834 |
| 2023/0420384 A1 * | 12/2023 | Nagarajan | H01L 23/367 |

FOREIGN PATENT DOCUMENTS

| | | |
|---|---|---|
| DE | 102006000724 A1 | 7/2007 |
| DE | 102016100280 A1 | 7/2017 |
| WO | 2015088486 A1 | 6/2015 |

* cited by examiner

*Primary Examiner* — Long Pham
(74) *Attorney, Agent, or Firm* — Harrity & Harrity, LLP

(57) ABSTRACT

A circuit arrangement has a chip arrangement in the form of an embedded Wafer Level Ball Grid Array (eWLB) arrangement with solder contacts on one side and a thermal interface on a side of the chip arrangement facing away from the solder contacts which is designed to dissipate heat from the semiconductor chip. In examples, the thermal interface has a thermally and electrically conductive material, wherein in a top view of the chip arrangement, a contact area in which the thermally and electrically conductive material is in thermal contact with the chip arrangement is limited to the fan-out area. In examples, the thermal interface has at least one RF absorption layer which is designed to absorb electromagnetic radiation at an operating frequency of the semiconductor chip.

27 Claims, 10 Drawing Sheets

CIRCUIT ARRANGEMENT WITH A THERMAL INTERFACE

RELATED APPLICATION

This application claims priority to German Patent Application No. 102020216456.8, filed on Dec. 22, 2020, which is incorporated herein by reference in its entirety.

FIELD

The present disclosure is concerned with circuit arrangements and in particular circuit arrangements with a chip arrangement in which a semiconductor chip, which is embedded in a potting compound, is arranged on one side of a redistribution layer structure, wherein solder contacts are arranged on the other side of the redistribution layer structure. Chip arrangements of this type are known as eWLBs (embedded Wafer Level Ball Grid Array). In particular, the present disclosure is concerned with cooling chip arrangements of this type on a side facing away from the solder contacts.

BACKGROUND

In many technical fields, such as radar applications in the automotive industry, for example, there are increasing requirements with regard to higher RF power densities (radio frequency power densities), a higher degree of transmit/receive integration (TX/RX integration) and a higher signal/noise resolution. In light of these requirements, heat management of electronic circuits is becoming increasingly important. In the case of package designs which are known as eWLB, cooling usually only takes place from the side on which the solder contacts are arranged.

There is therefore a need for improved heat management of electronic circuits and, in particular, eWLB circuits.

SUMMARY

Examples of the present disclosure establish a circuit arrangement with a chip arrangement, for example an embedded Wafer Level Ball Grid Array (eWLB) arrangement, which has a redistribution layer structure, a semiconductor chip, a potting material and solder contacts, wherein the semiconductor chip and the potting compound are arranged on one side of the redistribution layer structure, wherein the semiconductor chip is embedded in the potting material, and wherein the solder contacts are arranged on the other side of the redistribution layer structure, wherein the solder contacts are connected to connections of the semiconductor chip in an electrically conductive manner via conductor structures of the redistribution layer structure, wherein in a top view of the chip arrangement, at least some of the solder contacts are arranged outside the area in which the semiconductor chip is arranged. The circuit arrangement has a thermal interface on a side of the chip arrangement facing away from the solder contacts which is designed to dissipate heat from the semiconductor chip. The thermal interface has a thermally and electrically conductive material, wherein in a top view of the chip arrangement, a contact area in which the thermally and electrically conductive material is in thermal contact with the chip arrangement is limited to the area in which the semiconductor chip is arranged.

Examples of the present disclosure establish a circuit arrangement with a chip arrangement, for example an eWLB arrangement, which has a redistribution layer structure, a semiconductor chip, a potting material and solder contacts, wherein the semiconductor chip and the potting compound are arranged on one side of the redistribution layer structure, wherein the semiconductor chip is embedded in the potting material, and wherein the solder contacts are arranged on the other side of the redistribution layer structure, wherein the solder contacts are connected to connections of the semiconductor chip in an electrically conductive manner via conductor structures of the redistribution layer structure. The circuit arrangement has a thermal interface on a side of the chip arrangement facing away from the solder contacts which is designed to dissipate heat from a rear side of the semiconductor chip. The thermal interface has at least one RF absorption layer which is designed to absorb electromagnetic radiation at an operating frequency of the semiconductor chip.

Examples of the present disclosure establish circuit arrangements in which a heat dissipation also takes place on a side, rear side, of the chip arrangement facing away from the solder contacts, wherein the heat dissipation takes place taking into account RF behavior of an electronic circuit of the chip arrangement. More specifically, a negative influence on the RF behavior of the electronic circuit caused by the heat dissipation is intended to be reduced and optimally prevented. In examples of the disclosure, this is achieved by an electrically and thermally conductive material, for example metal, of a thermal interface being in partial or full contact with the chip arrangement only in the area in which, in a top view, the semiconductor chip is arranged, and not in the area in which, in a top view, the potting compound is arranged. In examples of the disclosure, this is achieved by the thermal interface having at least one RF absorption layer. In both cases, the influence of RF radiation leakage, which is emitted from the chip arrangement, on the behavior of the electronic circuit of the chip arrangement can be reduced, since the proportion of this RF radiation leakage which is reflected back to the chip arrangement may be reduced, compared to a case of a full-surface heat sink, for example in the form of a metal plate, on the rear side of the chip arrangement.

BRIEF DESCRIPTION OF THE DRAWINGS

Examples of the present disclosure are described hereinafter with reference to the accompanying drawings. In the drawings.

DETAILED DESCRIPTION

Examples of the present disclosure are described in detail hereinafter and using the accompanying drawings. It should be noted that the same elements or elements which have the same functionality may be provided with the same or similar reference numbers, a repeated description of elements which are provided with the same or a similar reference number typically being omitted. Descriptions of elements which have the same or similar reference numbers are interchangeable. In the following description, many details are described in order to provide a more thorough explanation of examples of the disclosure. However, it is clear to the persons skilled in the art that other examples may be implemented without these specific details Features of the various examples described can be combined with one another unless features of corresponding combination are mutually exclusive or such a combination is explicitly excluded.

The present disclosure is concerned with the heat management of chip arrangements in which a semiconductor chip is embedded in a potting material, wherein the potting material and the semiconductor chip are arranged on a redistribution layer structure, and wherein solder contacts, for example in the form of solder balls, are provided on a first side of the chip arrangement, which is also referred to as a front side herein. Chip arrangements of this type are also known as eWLB arrangements or eWLB package design. In examples of the present disclosure, the chip arrangement is an eWLB arrangement.

Figure 1:
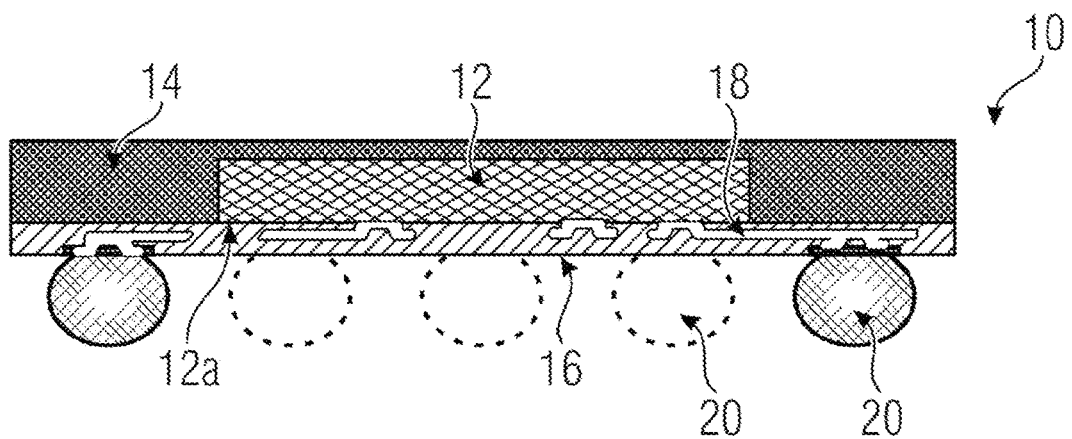
FIG. 1 shows a schematic cross-sectional representation of one example of a chip arrangement in the form of an eWLB arrangement.

A schematic cross-sectional view of one example of a chip arrangement in the form of an eWLB arrangement is shown in FIG. 1. The chip arrangement 10 has a semiconductor chip 12 and a potting compound 14 in which the semiconductor chip 12 is embedded. The potting compound 14 can consist of any suitable potting material, such as epoxy or acrylate, for example. The semiconductor chip 12 can be a silicon chip, for example, or have a different semiconductor material. The semiconductor chip 12 and the potting compound 14 are arranged on a redistribution layer structure 16. The redistribution layer structure 16 has one or a plurality of layers made of a dielectric material, such as silicon oxide or silicon dioxide, for example. A front side 12a of the semiconductor chip 12, in which active areas thereof are formed, faces the redistribution layer structure 16. The active areas form an electronic circuit of the semiconductor chip 12. The redistribution layer structure has conductor structures 18 which connect connections of the semiconductor chip 12 to solder contacts 20 in the form of solder balls on the front side of the chip arrangement 10 in an electrically conductive manner. The semiconductor chip 12 is embedded in the potting compound 14 in such a way that it is surrounded by the potting compound 14 on all four sides and the side, rear side, facing away from the redistribution layer structure 16. In other examples, the potting compound is not provided on the rear side of the semiconductor chip.

Figure 2:
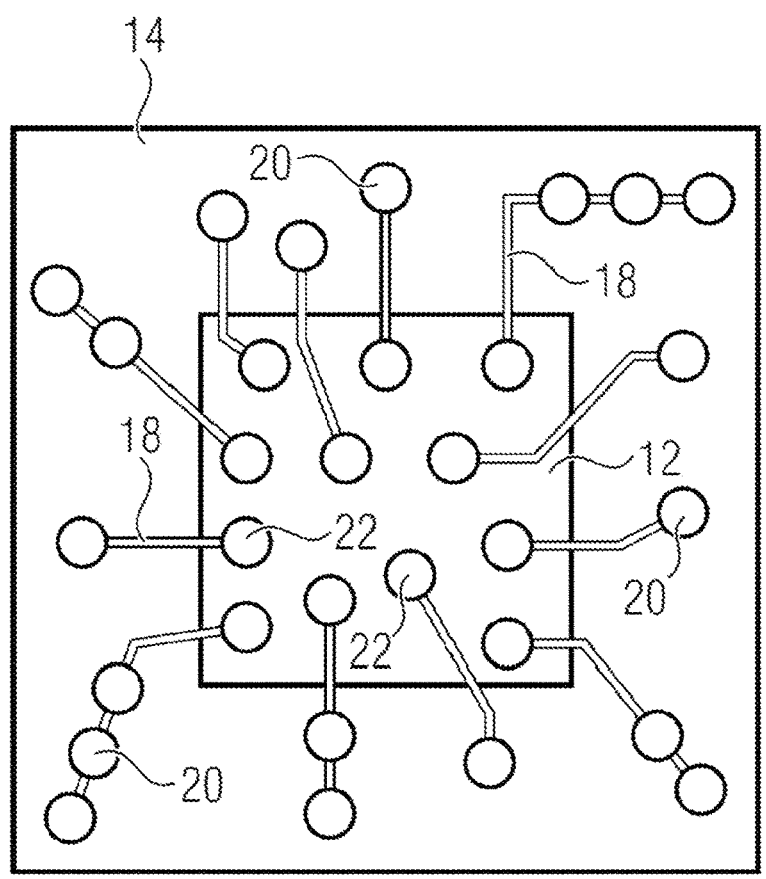
FIG. 2 shows a schematic representation of a front side of one example of an eWLB arrangement.

FIG. 2 schematically shows a partially transparent top view of the chip arrangement, wherein only features are shown which are important for the explanation. FIG. 2 shows connections 22 of the semiconductor chip 12 which are connected to the solder balls 20 via conductor structures 18. In a top view of the chip arrangement 10, at least some of the solder contacts 20 are arranged outside the area in which the semiconductor chip 12 is arranged. In other words, at least some of the solder contacts 20 are arranged in the area of the potting compound 14.

Figure 3:
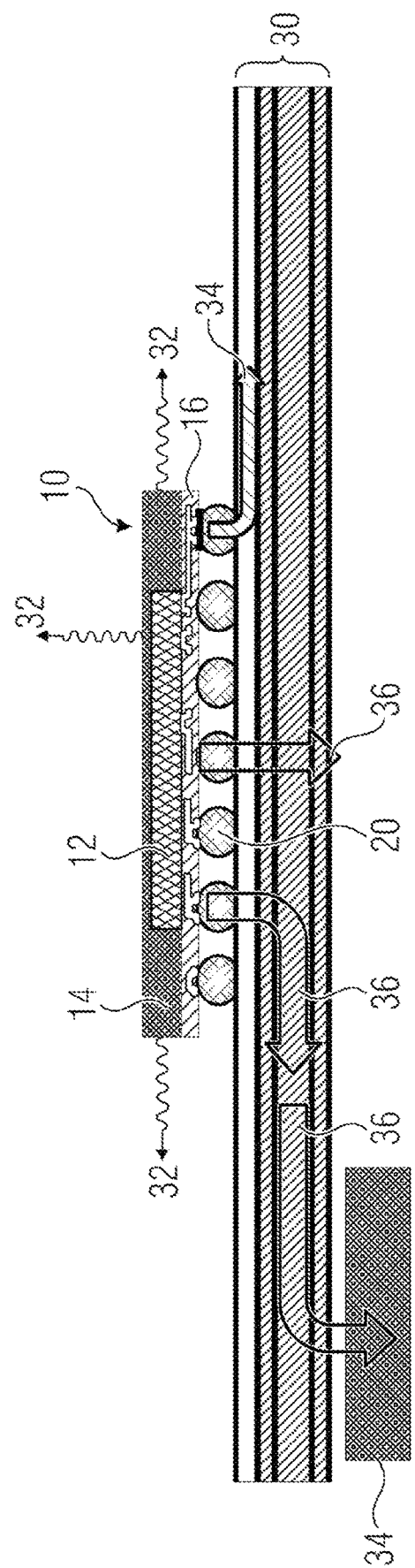
FIG. 3 shows a schematic cross-sectional representation of the chip arrangement from FIG. 1 which is arranged on a circuit board.

FIG. 3 shows a schematic cross-sectional view of a circuit in which the chip arrangement 10 is fixed to a circuit board 30. In this case, the solder contacts 20 are connected to conductor structures on the circuit board 30 in an electrically conductive manner. In examples, the semiconductor chip 12 is a radar chip which has transmit/receive circuits for a plurality of transmit/receive channels, for example for the automotive industry. In examples, the semiconductor chip is designed to process signals at an operating frequency of 1 GHz and above, for example at a frequency in a range between 70 and 80 GHz, such as 77 GHz, for example. As indicated in FIG. 3 by curved arrows 32, an RF radiation leakage occurs to all lateral sides and to the rear side during operation of the semiconductor chip. RF signal paths are formed on the circuit board 30, as indicated in FIG. 3 by an arrow 34. The RF radiation leakage can result in RF losses, interference and crosstalk between different channels.

Heat management usually takes place via the solder balls 20 and by way of the circuit board 30 which can be thermally coupled with a heat sink 34. This is indicated in FIG. 3 by thermal paths 36. The solder balls 20 transport the heat from the active side of the semiconductor chip 12 to the circuit board 30. However, the heat transport is limited by a heat accumulation on the circuit board. Furthermore, the dielectric material of the redistribution layer structure 16 greatly contributes to a high heat resistance and can account for 70% thereof, for example.

Figure 4A:
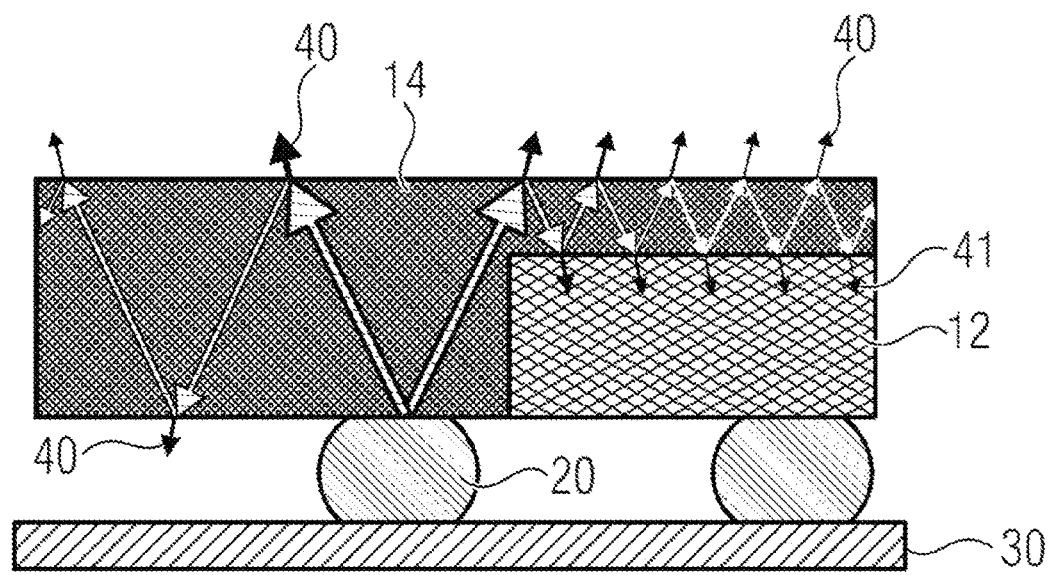
FIGS. 4A and 4B show schematic representations of a cut-out of an eWLB arrangement for explaining signal reflections.
Figure 4B:
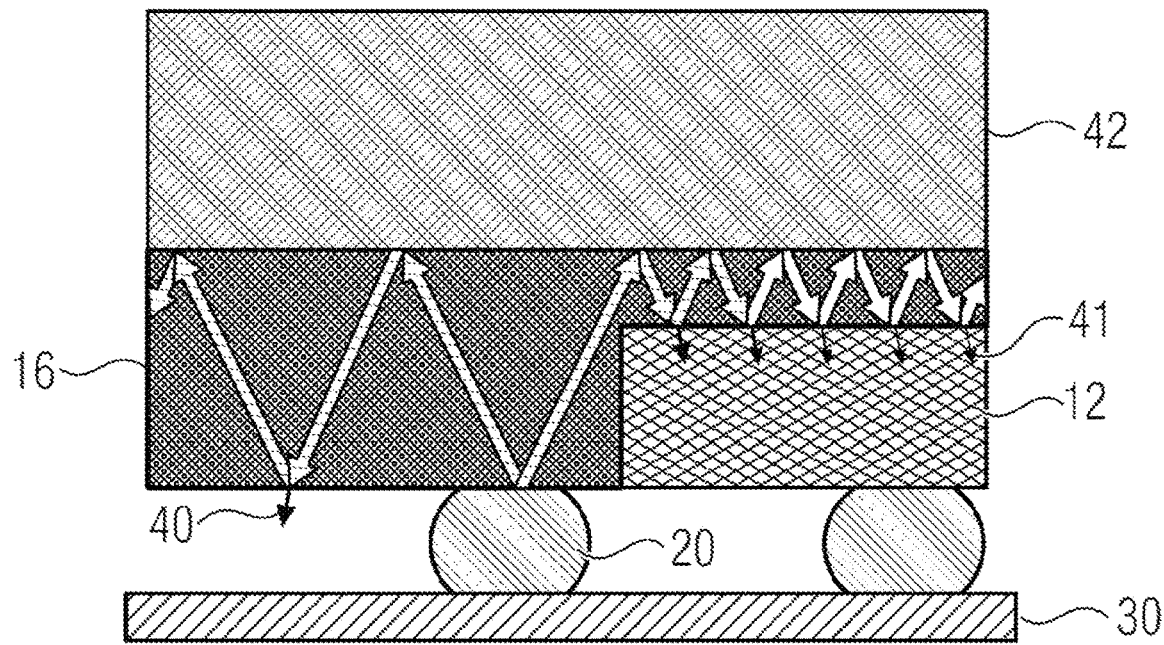

FIGS. 4A and 4B show an enlarged cut-out from a part of the semiconductor chip 12 and the potting compound 14. For the sake of simplicity, the redistribution layer structure is not represented here. RF radiation is represented in FIGS. 4A and 4B by respective arrows. RF radiation spreads out from the semiconductor chip 12 and is partially reflected at boundary surfaces of the potting compound 14. Part of the radiation leaves the potting compound 14, as indicated by arrows 40. Part of the radiation may get back into the semiconductor chip 12, as indicated by arrows 41.

Improved heat management could be obtained if a heat sink 42 made of a thermally conductive material, for example metal, were to be provided on the rear side of the chip arrangement 10, as shown in FIG. 4B. It has been recognized that a heat sink of this type would have the effect that a greater part of the RF radiation leakage would get back to the semiconductor chip 12 via additional reflection at the boundary surface between the heat sink 42 and semiconductor chip. It has further been recognized that the proximity of the heat sink 42 to the conductor structures in the potting compound may result in a waveguide effect, which may result in a higher level of parasitic signals which spread to neighboring channels and therefore in a higher level of crosstalk.

Figure 5:
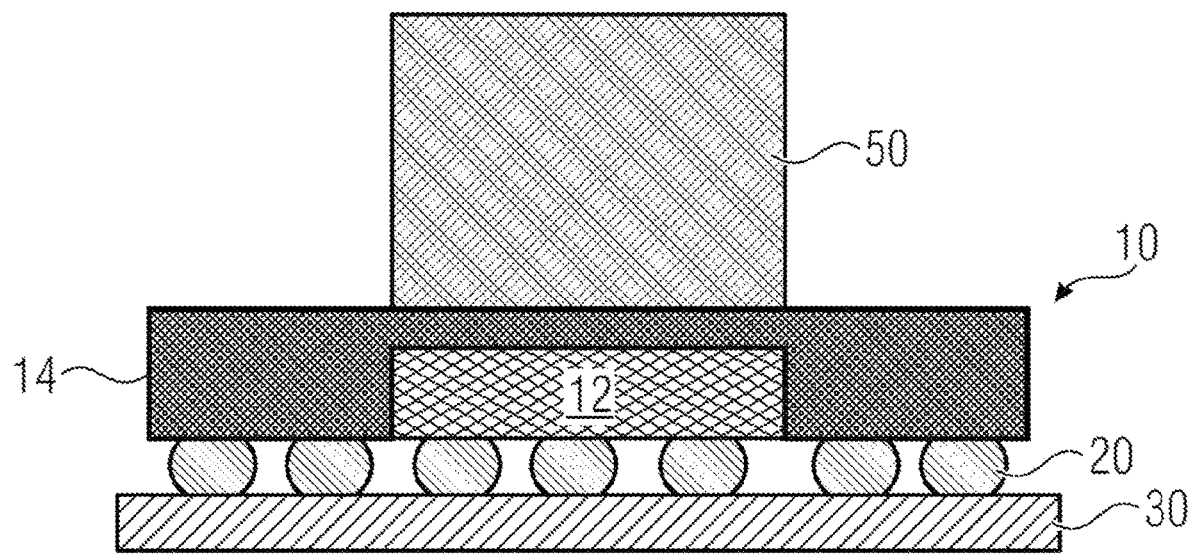
FIG. 5 shows a schematic representation of one example of a circuit arrangement with a heat sink on a rear side of a chip arrangement.

It has been recognized that problems of this type can be avoided if a thermal interface is used on the rear side of the chip arrangement which has a thermally and electrically conductive material, the contact area of which, in a top view of the chip arrangement, is limited to the area in which the semiconductor chip is arranged. FIG. 5 shows one example of a corresponding circuit arrangement which has the chip arrangement 10 which is represented in a simplified manner.

The circuit arrangement has a thermally conductive material 50 on the rear side of the chip arrangement 10, i.e., the side facing away from the solder contacts 20. In a top view, the thermally conductive material is provided within the outer limits of the semiconductor chip 12, but not outside the outer limits. In the example shown, the outer limits of the thermally conductive material 50 are flush in cross-section with those of the semiconductor chip 12. In a top view, the outer form of the material 50 can therefore correspond to the outer form of the semiconductor chip 12. In other examples, the outer limits of the thermally conductive material 50 can be arranged in cross-section within the outer limits of the semiconductor chip 12, which, however, may result in a reduced heat dissipation.

In this case, a thermally conductive material is intended to be understood herein to mean a material that in an operating temperature range has a thermal conductivity of at least 10 W/(m·K) in the heat dissipation direction. In this case, an operating temperature range can be considered to be a temperature range between −25° C. and 150° C., for example. The thermally conductive material can have a thermal conductivity of at least 100 W/(m·K), as is the case for some metals, for example. In examples, the thermally conductive material can be aluminum or copper.

Figure 8:
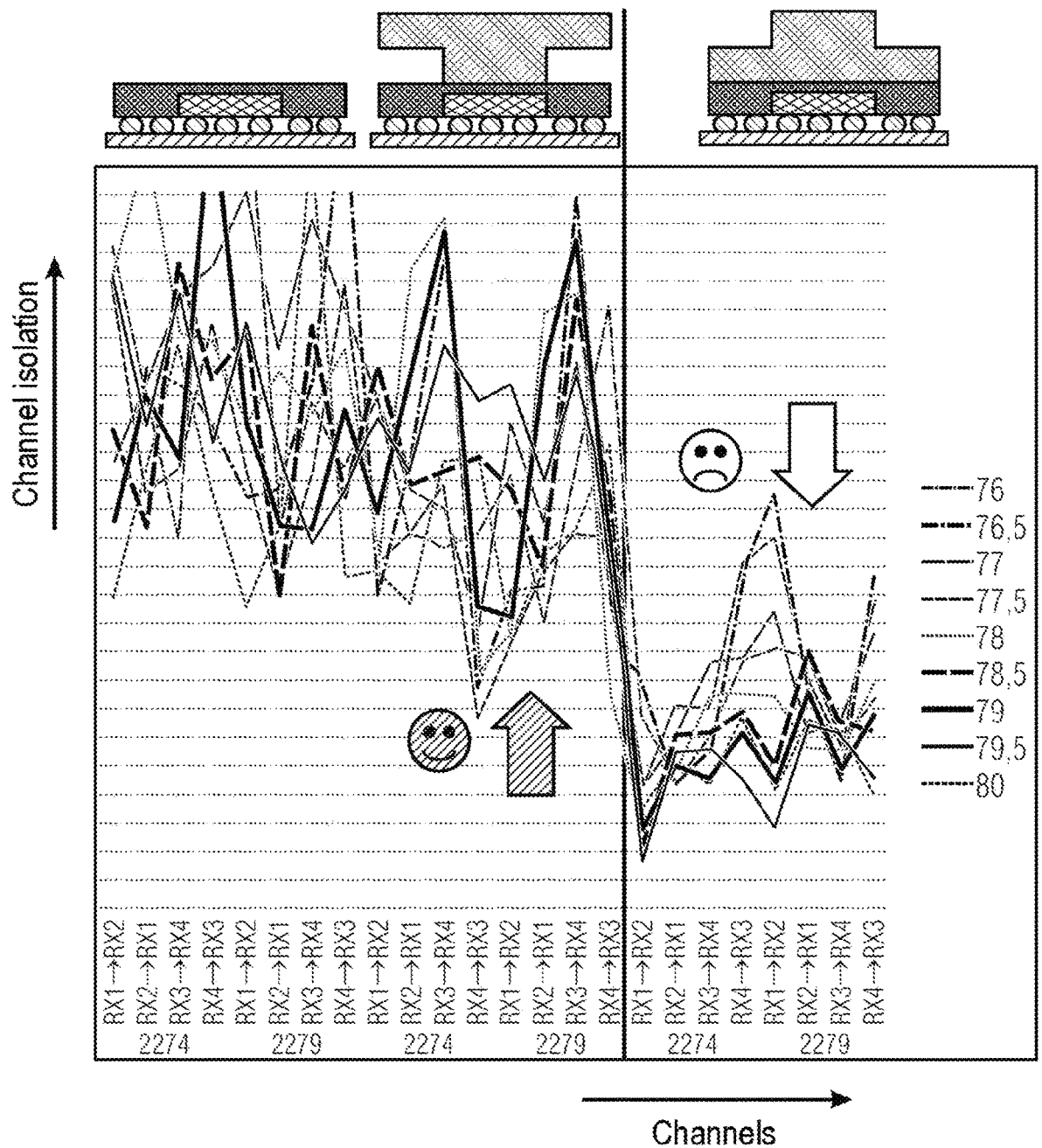
FIG. 8 shows schematic simulation results which show an isolation between transmit channels of a radar chip.

The provision of the thermally and electrically conductive material 50 on the rear side of the chip arrangement can significantly reduce the thermal resistance for a dissipation of heat from the semiconductor chip 12. In examples, this reduction in the thermal resistance can be up to 50% or above. However, a deterioration of the electrical behavior, as would be caused by full-surface provision of a heat sink, can be prevented at the same time. With regard to this, reference should be made to FIG. 8, which shows the channel isolation between receive channels RX1 to RX4 schematically. On the left side of the diagram, the results without a thermal interface on the rear side are represented, in the middle, the results with a thermal interface, wherein the thermally and electrically conductive material 50 is designed as a stepped metal stamp, and on the right side, the results if the metal stamp is inverted, i.e., the heat sink is in full-surface contact with the rear side of the chip arrangement. It is clearly recognizable that the material which is limited to the area of the semiconductor chip does not cause a substantial deterioration of the channel isolation, compared to the full-surface contact.

The area in which the semiconductor chip 12 is arranged is sometimes referred to as a fan-in area and the area in which the potting compound 14 is arranged is sometimes referred to as a fan-out area. In examples, the thermally and electrically conductive material is only in the fan-in area where the heat dissipation is most effective, and not in the fan-out area in contact with the rear side of the chip arrangement.

Figure 6:
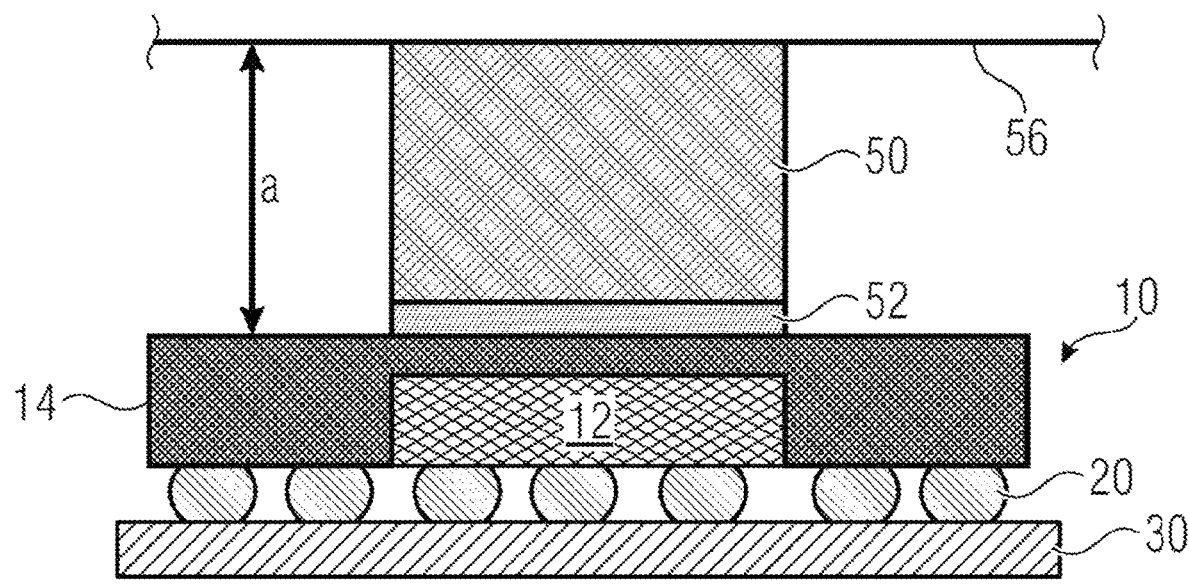
FIG. 6 shows a schematic representation of one example of a circuit arrangement with a heat sink and a heat paste between the heat sink and rear side of the chip arrangement.

The thermally and electrically conductive material 50 of the thermal interface can be a metal material. The material 50 can be designed as a heat sink which directly touches the rear side of the chip arrangement 10 mechanically in the contact area, as shown in FIG. 5. In other examples, a heat-conductive paste 52 can be provided between the thermally and electrically conductive material and the rear side of the chip arrangement 10, as shown in FIG. 6. The thermal contact can be improved as a result. The heat-conductive paste is only provided in the area in which the thermally and electrically conductive material 50 thermally contacts the rear side of the chip arrangement 10. The heat-conductive paste is not provided in the other areas. Since the heat-conductive paste 52 is not provided to the edge of the chip arrangement 10, on the one hand, less heat-conductive paste is required and, on the other hand, it is possible to prevent heat-conductive paste 52 from dripping onto the circuit board 30, whereby a resulting RF deterioration can, in turn, be avoided. This could occur if heat-conductive paste gets onto conductor structures on the circuit board 30.

Figure 7:
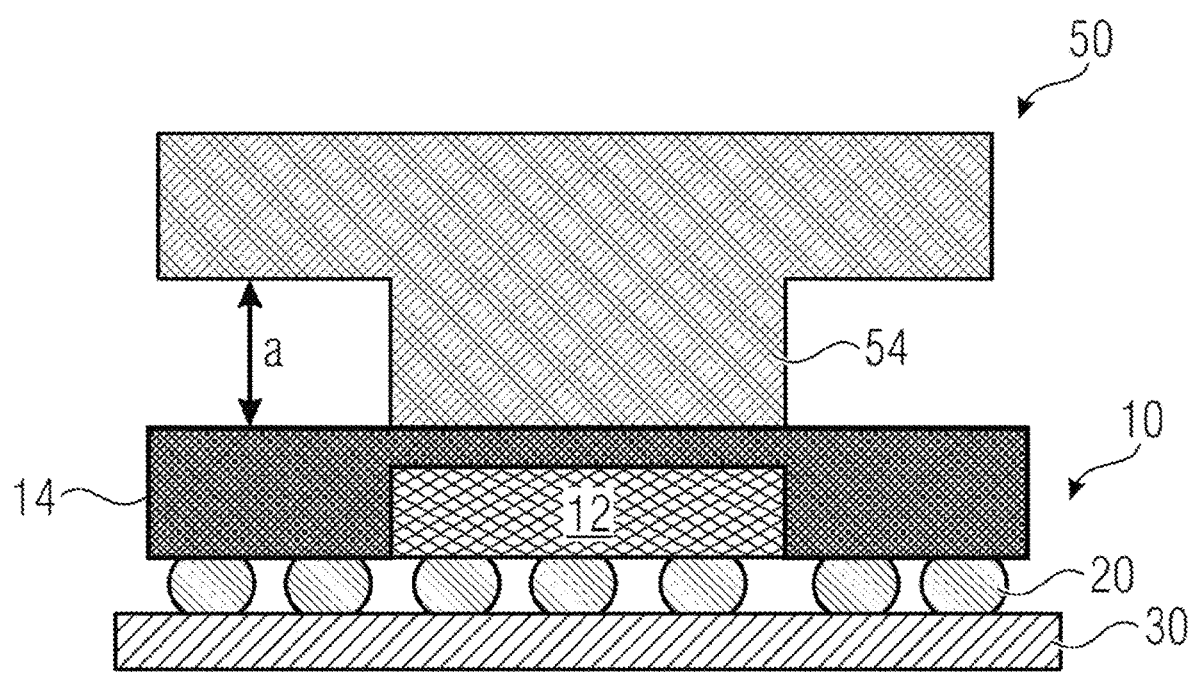
FIG. 7 shows a schematic representation of one example of a circuit arrangement with a stepped heat sink on a rear side of a chip arrangement.

FIG. 7 shows one example in which the thermally and electrically conductive material 50 is designed as a metallic heat sink in the form of a stamp which has a step 54 on the side facing the rear side of the chip arrangement. Parts of the stamp which are opposite the potting compound 14 are therefore spaced apart from it. As a result, the influence of these parts on the RF behavior of the chip arrangement can be reduced. In other examples, a housing part is arranged on the side of the material 50 facing away from the chip arrangement 10, which housing part has metallic parts which are opposite the potting compound 14. A housing part 56 of this type is indicated in FIG. 6. In examples, the circuit arrangement therefore has metal parts which are opposite areas of the chip arrangement 10 in which the semiconductor chip 12 is not arranged, on the side facing away from the redistribution layer structure with a distance therebetween. This distance is indicated with "a" in FIGS. 6 and 7. In examples, this distance is at least 1.5 mm or at least 2.5 mm, such that the influence of these metallic parts on the RF behavior is small. In examples, the distance can be suitably selected for an operating frequency of the semiconductor chip 12.

With reference to FIGS. 5 to 7, examples have been described in which a thermal contact between a thermal interface and the rear side of the chip arrangement, in a top view, is limited to the area of the semiconductor chip. Any thermally conductive material, for example a metal, can be used as thermally and electrically conductive material in these examples. In addition, in these examples, an RF absorption layer can be arranged between the thermally and electrically conductive material, in order to further reduce the influence on the RF behavior.

Examples are explained hereinafter in which the contact area of a thermal interface on the rear side of the chip arrangement does not have to be correspondingly limited. In fact, the thermal interface can be provided over the entire surface on the rear side of the chip arrangement in examples of this type. However, it should be noted at this point that the following embodiments, in particular with respect to the RF absorption layer, also apply to exemplary embodiments in which the contact area, in a top view, is limited to the area of the semiconductor chip.

As has already been mentioned previously, a full-surface application of a heat sink on the rear side of the chip arrangement would have a strong influence on the RF behavior of the circuit arrangement. It has been recognized that additionally or alternatively to a reduced contact area of the thermal interface, an additional cooling path can be provided on the rear side if the thermal interface is configured in such a way that an absorption of the RF energy radiated from the chip arrangement, which is a radiation leakage, takes place. In examples of the present disclosure, the thermal interface on the rear side of the chip arrangement, for example the chip arrangement which has been described previously with reference to FIGS. 1 to 3, is designed to dissipate heat from a rear side of the semiconductor chip, wherein the thermal interface has at least one RF absorption layer which is designed to absorb electromagnetic radiation at an operating frequency of the semiconductor chip.

In the examples, the thermal interface including the RF absorption layer is arranged over the entire surface on the rear side of the chip arrangement, i.e. in a top view both in the area of the semiconductor chip 12 and in the area of the potting compound 14. It is therefore possible to dissipate heat from the semiconductor chip 12 in both the lateral direction, i.e. parallel to the rear side, and in the vertical direction, i.e. perpendicular to the rear side.

In examples, the RF absorption layer has a material which has a dielectric loss factor tan δ of 0.2 or more at the operating frequency of the semiconductor chip 12. This makes it possible to absorb RF radiation into the RF absorption layer effectively, such that substantial proportions thereof can be prevented from being reflected back to the semiconductor chip 12. Furthermore, the RF absorption layer prevents a crosstalk from taking place as a result of waveguide effects, whereby an isolation of radar channels would be impaired, for example.

In examples, the RF absorption layer has such absorption losses for an electromagnetic radiation leakage emitted as a result of the operation of the semiconductor chip in the direction of the RF absorption layer that, in the case of a total reflection at the side of the thermal interface which is spaced apart from the chip arrangement, a maximum of 10% of this radiation leakage gets back to the chip arrangement. This makes it possible to prevent a negative influence of the thermal interface on electrical properties of the semiconductor chip effectively.

In examples of the present disclosure, a thickness of the RF absorption layer is in a range between 0.2 mm and 3 mm. It has been recognized that, depending on the material of the RF absorption layer, a sufficient absorption of the RF radiation can be achieved at such a thickness while still being able to achieve a sufficient heat dissipation at the same time.

In examples of the present disclosure, the RF absorption layer has a carbon material. The RF absorption layer can have carbon nanotubes, one or a plurality of graphene and/or graphite layers, a graphene foam and/or fillers made of RF absorbing particles, preferably organometallic carbonyl complexes. It has been recognized that materials of this type of a suitable thickness can be provided on the rear side of eWLB arrangements, in order to, on the one hand, achieve a reduction in the thermal resistance away from the chip arrangement and, on the other hand, to absorb RF radiation, in order to reduce or eliminate an impairment of the RF behavior.

In examples, the RF absorption layer can have a material that has a heat conductivity of at least 3 W/(m·K) or of at least 10 W/(m·K) in a direction perpendicular away from the rear side of the chip arrangement. In examples, the RF absorption layer can have a material that has a heat conductivity of at least 100 W/(m·K) in a direction parallel to the rear side of the chip arrangement. It has been recognized that the thermal interface can consist of only one single layer if the RF absorption layer consists of a material which has such properties.

In examples, the RF absorption layer can have structures into which eddy currents are induced by the RF radiation, such that the RF radiation is absorbed as a result. This makes it possible to use a material with a good thermal conductivity as an RF absorption layer. In examples, the structures can be formed by a hole pattern in an electrically conductive material. In the examples, the structures can be formed by a grid structure made of a conductive material in an otherwise non-conductive material. Structures of this type make it possible to absorb RF radiation in the operating frequency range effectively. In the examples, it can be laser-structured films in this case. Structures of this type make it possible to adapt the absorption frequency to the operating frequency of the semiconductor chip by adapting dimensions and distance between the structures, in order to optimize the absorption behavior for the operating frequency of the semiconductor chip.

In examples, in the potting material, i.e., the potting compound, channels which penetrate the potting compound can be provided which are filled with a thermally conductive material. A heat dissipation out of the chip arrangement can be further improved as a result.

In examples, the thermal interface can have a plurality of layers, of which at least one represents an RF absorption layer and at least one represents a thermally conductive layer. The layers can be arranged on the rear side of the chip arrangement in different order. This makes it possible to adjust the material and thickness of the layers in a flexible manner, in order to both achieve a reduction in the thermal resistance and to prevent a deterioration of the RF behavior.

The layers of the thermal interface may be applied in examples as coatings, i.e., non-self-supporting layers. In examples, the layers may be applied as self-supporting layers, for example using a suitable adhesion promoter. This makes it possible to use thinner or thicker layers made of the respective material as required.

In examples, the thermally conductive layer has a graphite layer or a graphite laminate. In examples, the thermally conductive layer is a graphite coating on the rear side of the chip arrangement. In examples, the RF absorption layer is a coating on the rear side of the chip arrangement. In examples, the coating which forms the RF absorption layer has a potting material which is filled with RF absorbing particles, for example carbonyl iron powder. It is therefore possible to apply the RF absorption layer and/or the thermally conductive layer of the thermal interface in a simple manner as a coating.

A heat sink, for example in the form of a metal stamp or in the form of a metallic housing part, can be in contact with the thermal interface on the side facing away from the chip arrangement. At least one of the layers of the thermal interface can be compliant and compressible, in order to compensate for surface irregularities of the chip arrangement and/or the heat sink.

In examples, a pressure which is exerted on the side, rear side, of the thermal interface facing away from the chip arrangement can be adjustable. As a result, a degree of compression of the RF absorption layer, which may have a graphene foam, for example, can be adjustable, wherein an absorption frequency of the RF absorption layer in turn depends on the degree of compression. The absorption frequency can therefore be adjusted to the operating frequency of the semiconductor chip, which may be different for different chip technologies.

Any suitable materials which provide the desired functionality can be used as materials for the one or plurality of layers of the thermal interface. Examples of the present disclosure are explained in greater detail hereinafter using different layer arrangements and materials. In examples, the thermal interface is designed to provide corresponding properties at the operating frequency of the semiconductor arrangement, which can be at 1 GHz and above, for example in a range from 70 to 80 GHz. In examples, the operating frequency can be at 77 GHz. At least one of the materials for the thermal interface is designed to have a strong RF absorption at such operating frequencies, in order to prevent RF leakage signals from the chip arrangement which are reflected back at a heat sink, such as a metal stamp, for example, arranged on the opposite side of the thermal interface from getting back into the chip arrangement, which could result in a disadvantageous mixing of transmit and receive channels.

The RF absorption behavior improves with increasing thickness of the thermal interface and in particular of the RF absorption layer thereof. In terms of a low thermal resistance Rth, in order to enable a maximum heat transport to an adjoining heat sink, the thermal interface should be as thin as possible and provide a good thermal contact to the chip arrangement, for example the eWLB wafer and a heat sink, which can be arranged on the side of the thermal interface facing away from the chip arrangement. With respect to the materials for the thermal interface (TIM=thermal interface material), the thermal resistance Rth should therefore, on the one hand, be as minimal as possible, while the thickness, on the other hand, must be sufficiently large in order to meet RF shielding requirements. In examples, the thickness should also be sufficiently large in order to compensate for surface roughness at boundary surfaces between the thermal interface and the chip arrangement and/or between the thermal interface and the heat sink. In examples, the resulting thickness of the thermal interface thus represents a compromise between the RF properties and the thermal properties.

In examples, the thermal interface, which can also be referred to as a rear side protection, can have a thickness in a range between 200 µm and 2000 µm, in order to, on the one hand, provide a sufficient RF absorption, furthermore a sufficiently low thermal resistance and, on the other hand, to compensate for surface roughness of the surfaces between which the thermal interface is arranged. In examples, material and thickness of the thermal interface are selected in such a way that the thermal conductivity for a heat transport away from the chip arrangement is at least 10 W/(m·K) and the thermal interface causes such absorption losses for an electromagnetic radiation leakage emitted as a result of the operation of the semiconductor chip in the direction of the thermal interface that, in the case of a total reflection at the side of the thermal interface which is spaced apart from the chip arrangement, a maximum of 10% of this radiation leakage gets back to the chip arrangement.

In examples, a higher thickness of the thermal interface can be compensated by increasing the thermal conductivity $\lambda$ of the thermal interface, for example by adding fillers with a high thermal conductivity. In examples, the thermal interface has a material which has both a high RF absorption and a low thermal resistance. In examples, the thermal interface has different materials, of which one is designed for a high RF absorption and one is designed for good thermal behavior.

From a material perspective, key factors for a good RF absorber are a high polarizability, the molecular motion and a porous structure.

RF absorbers are available as laminate layers, wherein, however, RF absorbers of this type frequently have poor thermal behavior as a result of a low thermal conductivity and a high thermal contact resistance. In examples, the RF absorption layer of the thermal interface can have a material which is available from the company Laird Technologies under the name Eccosorb® MMI.

However, there are also materials which offer both good thermal properties and good electromagnetic interference (EMI) and RF shielding. One example of materials of this type are carbon materials. Owing to the high electron polarizability of Π electrons in unsaturated bonds, carbon materials demonstrate high (DkDf) transmission losses for high frequencies in a range above 1 GHz.

In examples, the material of the thermal interface and in particular the RF absorption layer has 1D structures in the form of microscopic carbon nanotubes (CNT) and/or macroscopic CNT fibers. Structures of this type can in particular be used as filler for molding compounds or inks, for example. CNTs further have an adjustable length and an adjustable diameter, such that the absorption behavior is adjustable depending on the operating frequency of the chip arrangement.

In examples, the material of the thermal interface and in particular the RF absorption layer has 2D structures in the form of one or a plurality of graphene layers and/or graphite layers which can have a thickness of up to 200 µm.

In examples, the material of the thermal interface and in particular the RF absorption layer has a graphene foam as a porous 3D material. In examples, the foam can have a thickness of up to 1 mm. In examples, the graphene foam is a soft, compressible material, such that the pore size of the foam can be adjusted. As a result, the absorption frequency can be shifted and adjusted to the operating frequency of the chip arrangement by exerting a mechanical load on the thermal interface, for example by exerting a pressure on the thermal interface by way of a heat sink.

In examples, the material of the thermal interface and in particular the RF absorption layer has coatings and/or powder fillers for a microwave absorption in organometallic carbonyl iron complexes.

In examples, RF absorbers of this type can be applied to the rear side of an eWLB wafer as layer laminates or as spray coating.

As has been mentioned previously, the thermal interface has a sufficient thickness in order to achieve a sufficient RF absorption. This results in a thermal resistance Rth~d/λ. In order to achieve good thermal behavior, in examples, the thermal interface including the RF absorption layer has a thermal conductivity which is at least 3 W/(m·K), at least 5 W/(m·K) or at least 10 W/(m·K). In examples, the RF absorption layer of the thermal interface has a thermal conductivity of this type. In examples, the thermal interface has additional thermally conductive layers which have a significantly higher thermal conductivity.

A high thermal conductivity can be achieved in examples by using thermally highly conductive fillers. In examples, two different materials or material classes can be combined in one or a plurality of layers, in order to achieve a thermal conductivity of this type. One layer can be designed for maximum RF absorption and one layer for maximum thermal conductivity. Carbon materials are interesting for both requirements.

In examples, graphite laminates can be used as a thermally conductive layer owing to their high thermal conductivity. Graphite laminates can be provided on the rear side of the chip arrangement or an eWLB wafer, in order to distribute the heat from the fan-in area into the fan-out area. Layers of this type can have a high heat conductivity of 15 W/(m·K) and above in a direction perpendicular to the rear side of the chip arrangement (z direction) and a much higher heat conductivity of 1500 W/(m·K) and above in a direction parallel to the rear side of the chip arrangement (xy direction). In examples, the thermal interface can have a graphite layer of a thickness of 17 µm. A layer of this type has a thermal conductivity $\lambda_{xy}$=1600_W/(m·K) in the layer plane (i.e., parallel to the rear side of the chip arrangement) and a thermal conductivity $\lambda_z$=18 W/(m·K) through the layer plane (i.e. perpendicular to the rear side of the chip arrangement).

In examples, the thermal interface can have a graphite layer of a thickness of 200 μm. A layer of this type has a thermal conductivity $\lambda_{xy}=500\_W/(m\cdot K)$ in the layer plane (i.e. parallel to the rear side of the chip arrangement) and a thermal conductivity $\lambda_z=5$ W/(m·K) through the layer plane (i.e. perpendicular to the rear side of the chip arrangement).

In examples, the thermal interface can have a graphite coating on the rear side of the chip arrangement which has been applied by means of chemical vapor deposition (CVD), for example. Such a deposition of a graphite coating can result in better heat distribution in the fan-out region.

Examples of thermal interfaces are described hereinafter which can be implemented using the above-described materials and material class, for example. The thermal interfaces can in particular be designed in order to provide both good thermal conductivity and good RF absorption behavior, wherein carbon materials are in particular suitable here. In examples, the thermal interface has a combination of two different material classes and layer thicknesses.

Figure 10:
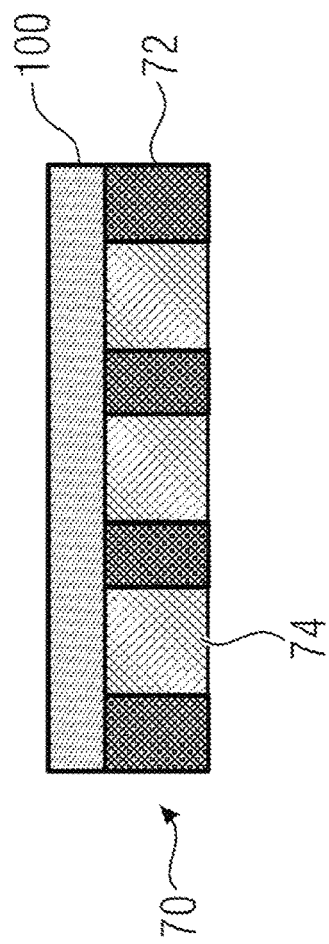
FIGS. 10 to 15 show schematic cross-sectional views of examples of circuit arrangements with thermal interfaces which have RF absorption layers.
Figure 9:
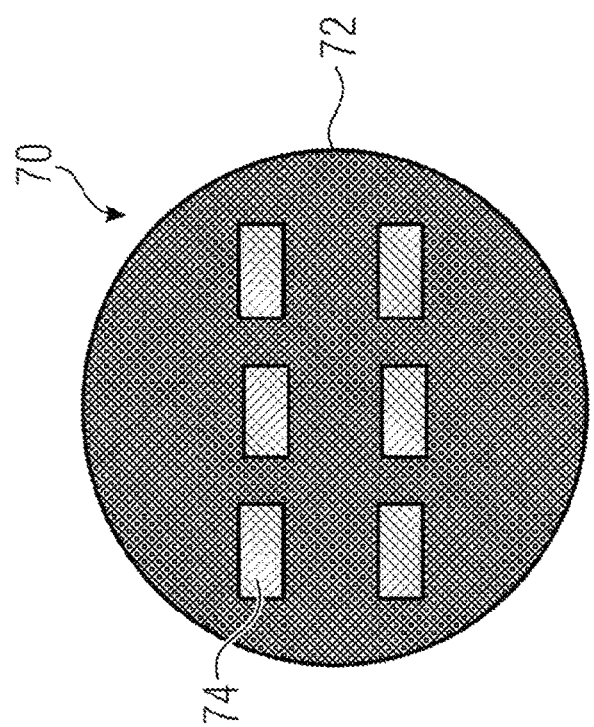
FIG. 9 shows a schematic view of a rear side of one example of an eWLB wafer.

FIG. 9 shows a schematic view of a rear side of an eWLB wafer 70, wherein a potting compound 72 is represented as at least partially transparent, such that semiconductor chips 74 can be identified in the wafer 70. Thermal interfaces as they are described herein can be applied to the rear side of the wafer 70 before the wafer is singulated, in order to generate circuit arrangements as they are described herein. FIG. 10 shows a schematic cross-sectional view of the wafer 70, wherein a thermal interface 100 is formed on the rear side of the wafer 70. It should be noted that the potting compound 72 is not provided on the rear side of the semiconductor chip 74 in the representation in FIG. 10. In other examples, the potting compound 72 is also provided on the rear side of the semiconductor chip 74.

Alternatively, thermal interfaces can be formed on the rear side of the chip arrangements after the singulation of the wafer into respective chip arrangements, in order to generate circuit arrangements, as they are described herein.

Figure 11:
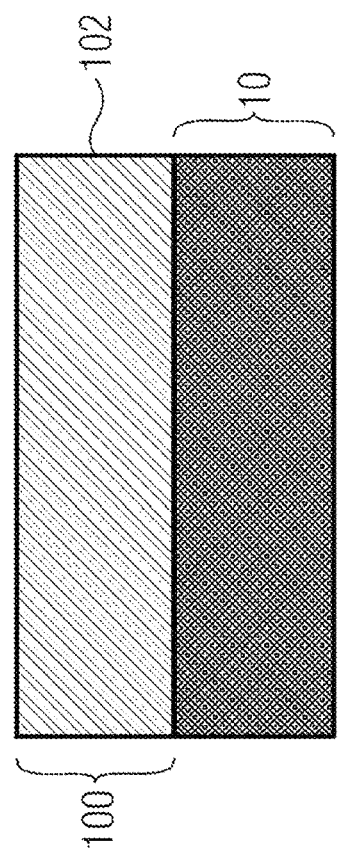

FIG. 11 shows one example of a circuit arrangement with a chip arrangement 10 and a thermal interface 100. As with all the examples described herein, the chip arrangement 10 can be a chip arrangement as described previously with reference to FIGS. 1 to 3. The thermal interface 100 has a layer arrangement 102 which has one single layer or a laminate made of a material which offers both thermal conductivity and an RF absorption capacity. For example, the thermal interface 100 can consist of one single graphite layer or a graphite laminate. Alternatively, the layer arrangement 102 can consist of a laminate layer, as is available from the company 3M under the name "3M mm Wave Hybrid Absorber for 5G", and which has a thermal conductivity of 3 W/(m·K) in the thickness direction at a thickness of 1 mm.

Figure 12:
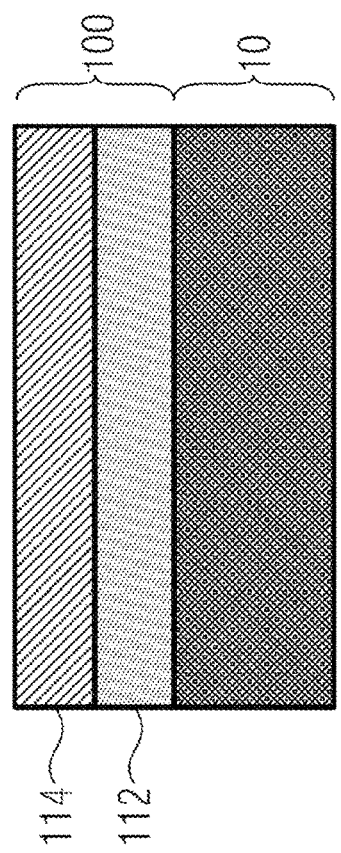

FIG. 12 shows one example in which the thermal interface 100 has a first layer arrangement 112 which is arranged on the chip arrangement 10 and a second layer arrangement 114 which is arranged on the first layer arrangement 112. The first and the second layer arrangements 112 and 114 can in each case have one single layer or a laminate. The first layer arrangement 112 is designed for good heat distribution and can have a heat conductivity of at least $\lambda_2 \geq 5$ W/(m·K) in the thickness direction and $\lambda_{xy} \geq 500$ W/(m·K) in the plane of the first layer arrangement 112, for example. In examples, the first layer arrangement 112 can be a graphite laminate, for example one of the graphite laminates described previously. The high thermal conductivity in the plane of the first layer arrangement 112 enables a heat propagation in the fan-out area of the chip arrangement. The second layer arrangement 114 is designed for good RF absorption and the material of the second layer arrangement 114 can have a dielectric loss factor $\delta \geq 2$ at the operating frequency of the semiconductor chip of the chip arrangement, for example. In examples, the second layer arrangement can have a thickness from 0.5 mm to 1.0 mm. In examples, the second layer arrangement 114 can have the material specified previously from the company Laird Technologies, which is available under the name Eccosorb® MMI. In examples, the second layer arrangement 114 can have a graphene foam. In examples, the order of the first layer arrangement 112 and the second layer arrangement 114 on the chip arrangement 10 can be reversed, wherein, however, the arrangement shown may be preferred owing to the better lateral heat distribution near to the chip arrangement.

In examples, the thermal interface can have a coating of the rear side of the chip arrangement and a layer arrangement arranged on the coating which can consist of a layer or a laminate. In this case, the coating can be applied to the rear side of the chip arrangement before the layer arrangement is laminated onto the coating by means of an adhesion promoter, for example.

Figure 13:
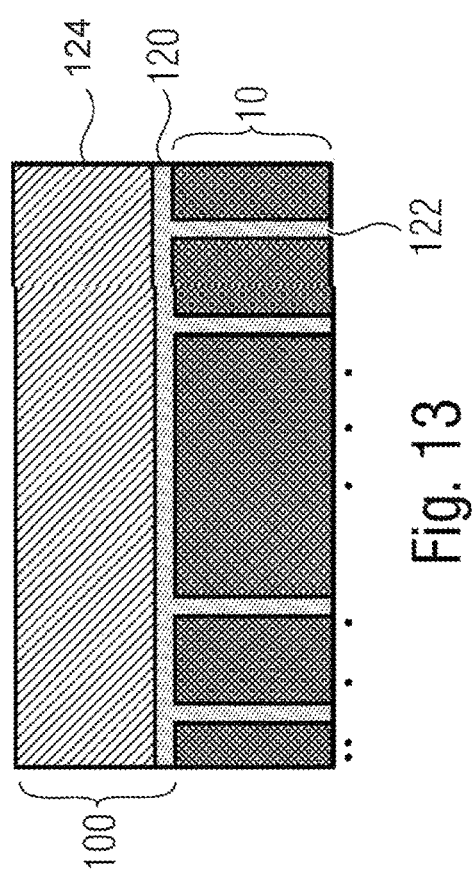

FIG. 13 shows one example in which a coating 120, for example, a graphite coating, is applied to the rear side of the chip arrangement 10 as a thermally conductive layer. The high in-plane thermal conductivity of the coating 120 enables good heat distribution into the fan-out area of the chip arrangement 10. As shown in FIG. 13, vertical channels 122, which are filled with the thermally conductive coating material, can be structured into the chip arrangement 10. The channels 122 can be formed by drilling in the potting compound of the chip arrangement and/or by etching in the semiconductor material of the semiconductor chip, for example. These channels 122 filled with a thermally conductive material can improve vertical heat dissipation from the front side of the chip arrangement to the rear side of the chip arrangement, where the heat can be dissipated via the thermal interface and a heat sink. A layer arrangement 124 is arranged on the coating 120, which layer arrangement can have a layer or a laminate and which is designed for RF absorption. The structure of the layer arrangement 124 can correspond to that of the second layer arrangement 114 which is shown in FIG. 12. The thickness of the layer arrangement 124 can be 0.5 mm to 1.0 mm and can compensate for surface roughness at boundary surfaces between the coating 120 and the layer arrangement 124 and between the layer arrangement 124 and a heat sink on the side facing away from the chip arrangement.

Figure 14:
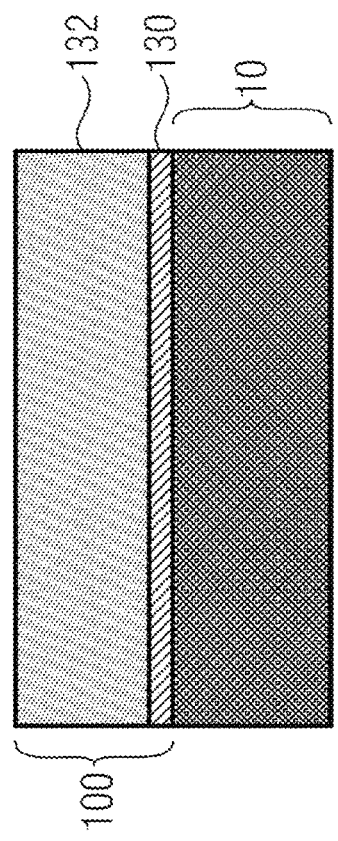

FIG. 14 shows one example in which the rear side of the chip arrangement is provided with an RF absorbing spray coating 130. The spray coating can be a carbonyl iron coating (for example from the company BASF) or an ink which is provided with RF absorption filler (for example from the company MWT Materials). A thermally conductive layer arrangement 132 is formed on the spray coating 130. The structure of the thermally conductive layer arrangement 132 can correspond to the structure of the first layer arrangement 112 in FIG. 12. The layer arrangement 132 can be a soft, compressible layer or a soft, compressible laminate with a thickness of 0.2 mm, in order to be able to compensate for surface roughness at boundary surfaces between the coating 130 and the layer arrangement 132 and between the layer arrangement 132 and a heat sink on the side facing away from the chip arrangement.

In other examples, instead of the coating 130 shown in FIG. 14, a layer made of a potting material which is filled with RF absorption particles can be formed on the rear side of the chip arrangement. In examples, the RF absorption particles can be carbonyl iron powder, for example from the company BASF.

As has been described previously with reference to FIG. 12, in examples, the thermal interface has two layer arrangements, of which one is designed for thermal conductivity and one for RF absorption. In examples, the layer arrangement designed for the RF absorption can have a graphene foam. The layer arrangement designed for the thermal conductivity can have a graphite layer or a graphite laminate. These two carbon materials are soft and compressible, wherein Rth properties and/or RF properties of the thermal interface can be adjusted by exerting a mechanical load on a thermal interface which has one or both corresponding layer arrangements.

Figure 15:
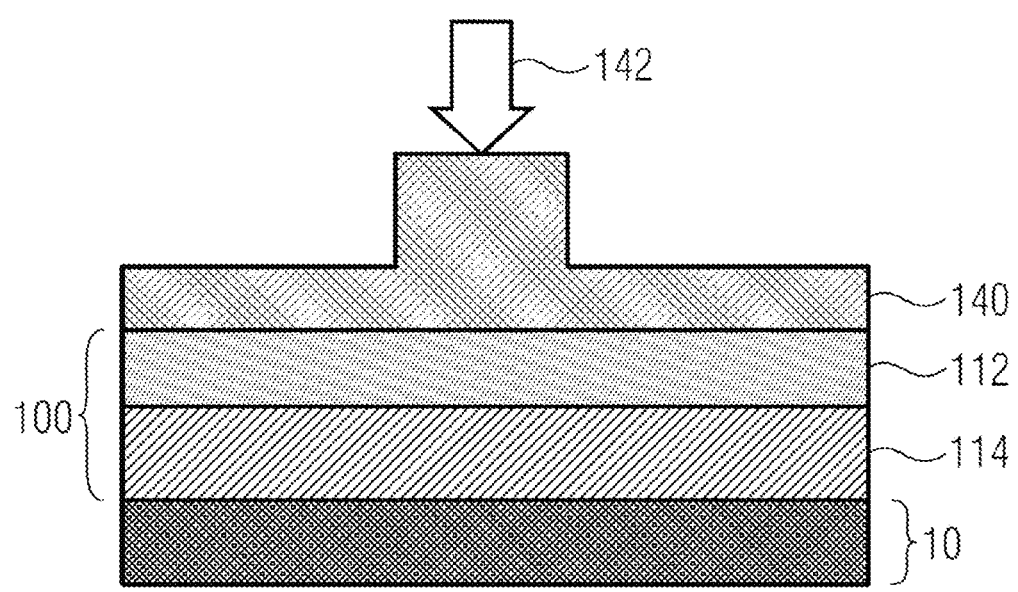

FIG. 15 shows one example in which the thermal interface 100 has the RF absorption layer 114 and the thermally conductive layer 112. The order of these layers on the chip arrangement 10 can, in turn, be reversed. A heat sink 140 is in contact with the rear side of the thermal interface. The heat sink 140 can exert a mechanical load on the thermal interface, as indicated by an arrow 142 in FIG. 15. In examples, the thermally conductive layer 112 consists of graphite, wherein the thermal resistance thereof can be reduced by increasing the mechanical load 142, i.e. the force exerted by the heat sink. In examples, the RF absorption layer 114 consists of a graphene foam. The RF absorption spectrum of the graphene foam can be shifted by exerting a compressible load on the material. More specifically, a deformation of the cavities in the graphene foam in response to a mechanical load causes a shift in the RF resonance frequency. By exerting a pressure on the thermal interface 100, for example using the heat sink 140, the absorption frequency can therefore be adjusted to an operating frequency of the semiconductor chip, wherein the operating frequency may vary for different chip technologies.

The use of a compliant material which has cavities that can be deformed by mechanical load thus makes it possible to adjust the absorption frequency, i.e., the frequency at which the absorption is maximum. In particular, this can be advantageous in radar applications in which different transmit/receive layouts and product requirements may require different frequency behavior. A tuning of the RF properties of the thermal interface can thus take place by changing the force exerted on the heat sink and thus the thermal interface. Instead of the design of a new material for the thermal interface for each variation, it may therefore be sufficient to adjust the force on the heat sink, in order to change the resonance frequency of the thermal interface. This adjustment can take place by means of a screw mechanism or the like, for example, which is fixed to an external housing via which a pressure can be exerted on the heat sink.

In examples in which the thermally conductive layer of the thermal interface has the graphite layer and the RF absorption layer has the graphene foam, a slight increase in the force on the thermal interface may not only change the absorption frequency but may also improve Rth owing to a better thermal boundary surface contact.

In examples, the layers or layer arrangements of the thermal interface can be applied or laminated using an adhesion promoter in each case. The adhesion promoter can be a PET adhesion promoter (polyethylene terephthalate adhesive) of a thickness of 3 to 5 μm, for example.

In all of the circuit arrangements described herein, a heat sink can be in mechanical contact with the rear side of the thermal interface in each case. The heat sink can be in full-surface mechanical contact with the rear side of the thermal interface. The heat sink can be formed by a metal stamp, for example, or by parts of a metal housing in which the chip arrangement is housed. In examples, the metal stamp can be pressed against the rear side of the thermal interface by external housing parts.

Examples of the present disclosure therefore establish circuit arrangements which enable a rear side cooling of chip arrangements, without unduly impairing the RF behavior. Examples enable an improved cooling of eWLB arrangements by providing an RF absorbing rear side protection with a low thermal resistance Rth. In this case, examples are based on a combination of RF/EMI absorbers and thermally highly conductive carbon materials. In examples, the RF resonance may be adjusted based on different product requirements by adjusting a mechanical force exerted on a heat sink. Examples of the present disclosure use RF absorber materials and thermal interface materials which are commercially available. Examples of the disclosure use a combination of available materials, in order to implement an additional rear side cooling path in eWLB arrangements, which can result in a reduction in the thermal resistance by 50%. In examples, the RF absorption layer can in particular be adapted in order to absorb RF radiation at a frequency between 70 and 80 GHz. In examples, the resonance frequency of the RF absorption material can be adjusted to 77 GHz.

Examples of the present disclosure thus enable a significant improvement in the heat dissipation without any noticeable deterioration of the RF properties such as a reduction in channel isolation, for example. Examples thus enable higher semiconductor chip temperatures, since the heat generated can be dissipated more effectively owing to the reduced thermal resistance. Examples thus enable integrated circuits, for example MMICs (monolithic microwave integrated circuit), with higher power loss. According to the present disclosure, the additional heat dissipation does not take place via additional solder balls or via the front side of the chip arrangement. It is therefore independent of problems which may occur as a result of the ageing of the solder balls. Additional thermal passages are also not required on the circuit board, which would result in additional space requirement and thus in higher costs. Since the heat dissipation is improved, higher duty cycles are also possible, which, in turn, may result in faster process times. Examples of the present disclosure are in particular suitable for radar systems in the automotive industry, where ever higher RF power densities represent increasing system challenges for RF behavior and thermal behavior, in particular on eWLB wafer package level. In this case, examples enable higher power densities and a higher degree of TX/RX integration by adding a rear side cooling path, without unduly impairing the RF behavior.

It is expected that the techniques described can be applied in all conceivable areas, for example eWLB-housed RFIC applications (integrated RF circuit) and MMIC applications. It is expected that the techniques described can also be applied at higher frequencies, for example beyond 100 GHz or in the THz range. Exemplary applications may refer to radar systems in particular in the automotive industry, communication systems with high data rates, such as 5G, for example, wireless retrieval systems, body scanning systems for safety purposes, medical health monitoring systems, Gbit automotive Ethernet, camera interfaces, gaming sensors, Industry 4.0, food monitoring, radio astronomy and earth monitoring.

Despite the fact that some aspects of the present disclosure have been described as features related to a device, it is clear that a description of this type may also be regarded as a description of corresponding method features. Despite the fact that some aspects have been described as features related to a method, it is clear that a description of this type may also be regarded as a description of corresponding features of a device or the functionality of a device.

The preceding disclosure provides illustrations and descriptions, but it is not intended that they be exhaustive or that the implementations be limited to the precise form disclosed. Modifications and variations are possible with respect to the above disclosure or may be obtained from the practice of implementations. Despite the fact that specific combinations of features are mentioned in the claims and/or disclosed in the description, it is not intended that these features limit the disclosure of possible implementations. In fact, many of these features can be combined in ways that are not specifically mentioned in the claims and/or disclosed in the description. Despite the fact that each of the dependent claims mentioned below may only depend directly on one or some claims, the disclosure comprises possible implementations of each dependent claim in combination with all other claims in the set of claims.

The examples described previously are merely representing the principles of the present disclosure. It should be understood that modifications and variations of the arrangements and the details which are described are clear to persons skilled in the art. It is therefore intended that the disclosure be limited only by the accompanying claims and not by the specific details which are set out for the purpose of describing and explaining the examples.

What is claimed is:

1. A circuit arrangement, comprising:
a chip arrangement comprising a redistribution layer structure including a first side and a second side arranged opposite to the first side, a semiconductor chip, a potting compound, and solder contacts,
  wherein the semiconductor chip and the potting compound are arranged on the first side of the redistribution layer structure,
  wherein the semiconductor chip is embedded in the potting compound,
  wherein the solder contacts are arranged on the second side of the redistribution layer structure,
  wherein the solder contacts are connected to connections of the semiconductor chip in an electrically conductive manner via conductor structures of the redistribution layer structure, and
  wherein in a top view of the chip arrangement, at least one of the solder contacts is arranged outside an area that overlaps with the semiconductor chip; and
a thermal interface on a side of the chip arrangement facing away from the solder contacts that is configured to dissipate heat from the semiconductor chip,
  wherein the thermal interface has a thermally and electrically conductive material, and
  wherein in the top view of the chip arrangement, a contact area at which the thermally and electrically conductive material is in thermal contact with the chip arrangement is limited to the area that overlaps with the semiconductor chip.

2. The circuit arrangement as claimed in claim 1, further comprising:
metal parts that are opposite areas of the chip arrangement in which the semiconductor chip is not arranged, on the side facing away from the solder contacts,
  wherein a distance of the metal parts from the chip arrangement is at least 1.5 mm.

3. A circuit arrangement, comprising:
a chip arrangement comprising:
  a redistribution layer structure including a first side and a second side arranged opposite to the first side,
  a semiconductor chip,
  a potting compound, and
  solder contacts,
  wherein the semiconductor chip and the potting compound are arranged on the first side of the redistribution layer structure,
  wherein the semiconductor chip is embedded in the potting compound,
  wherein the solder contacts are arranged on the second side of the redistribution layer structure, and
  wherein the solder contacts are connected to connections of the semiconductor chip in an electrically conductive manner via conductor structures of the redistribution layer structure; and
a thermal interface arranged on a side of the chip arrangement facing away from the solder contacts that is configured to dissipate heat from a rear side of the semiconductor chip,
  wherein the thermal interface has at least one radio-frequency (RF) absorption layer that is configured to absorb electromagnetic radiation at an operating frequency of the semiconductor chip.

4. The circuit arrangement as claimed in claim 3, wherein the thermal interface is arranged on the rear side of the semiconductor chip facing away from the redistribution layer structure and on a side of the potting compound facing away from the redistribution layer structure.

5. The circuit arrangement as claimed in claim 3, wherein the at least one RF absorption layer has a material that has a dielectric loss factor tan δ of 0.2 or more at the operating frequency of the semiconductor chip.

6. The circuit arrangement as claimed in claim 3, wherein the at least one RF absorption layer has such absorption losses for an electromagnetic radiation leakage emitted as a result of an operation of the semiconductor chip in a direction of the RF absorption layer that, in the case of a total reflection at a side of the thermal interface that is spaced apart from the chip arrangement, a maximum of 10% of this radiation leakage gets back to the chip arrangement.

7. The circuit arrangement as claimed in claim 3, wherein the at least one RF absorption layer has a thickness in a range from 0.2 mm to 3 mm.

8. The circuit arrangement as claimed in claim 3, wherein the at least one RF absorption layer has a carbon material.

9. The circuit arrangement as claimed in claim 3, wherein the at least one RF absorption layer has at least one of: carbon nanotubes, at least one graphene layer, at least one graphite layer, a graphene foam, or a filler made of RF absorbing particles having organometallic carbonyl complexes.

10. The circuit arrangement as claimed in claim 3, wherein the at least one RF absorption layer has a material that has a heat conductivity of at least 3 W/(m·K) in a direction away from the chip arrangement.

11. The circuit arrangement as claimed in claim 3, wherein the at least one RF absorption layer comprises induction structures that are configured to convert RF radiation from the chip arrangement into eddy currents.

12. The circuit arrangement as claimed in claim 11, wherein the induction structures have a grid structure made of an electrically conductive material or a hole pattern in an electrically conductive material.

13. The circuit arrangement as claimed in claim 3, wherein the chip arrangement comprises channels that extend from the redistribution layer structure to a surface of the chip arrangement facing away from the redistribution layer structure, wherein the channels are filled with a thermally conductive material.

14. The circuit arrangement as claimed in claim 3, wherein the thermal interface has the at least one RF absorption layer and at least one thermally conductive layer,
wherein the at least one thermally conductive layer has a higher heat conductivity than the at least one RF absorption layer,
wherein the at least one RF absorption layer has a higher absorption capacity for the electromagnetic radiation at the operating frequency of the semiconductor chip than the at least one thermally conductive layer, and
wherein the at least one RF absorption layer is arranged between the chip arrangement and the at least one thermally conductive layer or the at least one thermally conductive layer is arranged between the chip arrangement and the at least one RF absorption layer.

15. The circuit arrangement as claimed in claim 14, wherein the at least one thermally conductive layer has a graphite layer or a graphite laminate.

16. The circuit arrangement as claimed in claim 14, wherein the at least one thermally conductive layer has a coating made of a thermally conductive material on the chip arrangement and the at least one RF absorption layer is arranged on the coating made of the thermally conductive material.

17. The circuit arrangement as claimed in claim 14, wherein the at least one RF absorption layer has a coating made of an RF absorbing material disposed on the chip arrangement and the at least one thermally conductive layer made of a thermally conductive material and is arranged on the coating made of the RF absorbing material such that the coating made of an RF absorbing material is interposed between the chip arrangement and the at least one thermally conductive layer.

18. The circuit arrangement as claimed in claim 17, wherein the coating made of the RF absorbing material has a potting material that is filled with RF absorbing particles, including carbonyl iron powder.

19. The circuit arrangement as claimed in claim 3, wherein the thermal interface comprises at least one layer that is compliant and compressible in order to compensate for surface irregularities of the chip arrangement.

20. The circuit arrangement as claimed in claim 3, further comprising:
a stamp made of a thermally and electrically conductive material that is in mechanical contact with a side of the thermal interface facing away from the chip arrangement.

21. The circuit arrangement as claimed in claim 20, wherein the RF absorption layer has graphene foam,
wherein a pressure which can be exerted by the stamp on the RF absorption layer is adjustable in order to adjust an absorption frequency of the RF absorption layer.

22. The circuit arrangement as claimed in claim 1, wherein the thermally and electrically conductive material comprises a first portion having a first lateral dimension that defines the contact area and a second portion that laterally extends from the first portion to define a second lateral dimension that is greater than the first lateral dimension,
wherein the first portion vertically extends from the contact area to the second portion, and
wherein a lateral extension of the second portion hangs over the potting compound outside the area that overlaps with the semiconductor chip to thereby define a gap between the second portion and the potting compound.

23. The circuit arrangement as claimed in claim 22, wherein the thermally and electrically conductive material has a T-shape in a cross-sectional view thereof.

24. A circuit arrangement, comprising:
a chip arrangement comprising a redistribution layer structure including a first side and a second side arranged opposite to the first side, a semiconductor chip, a potting compound, and solder contacts,
wherein the semiconductor chip and the potting compound are arranged on the first side of the redistribution layer structure,
wherein the semiconductor chip is embedded in the potting compound,
wherein the solder contacts are arranged on the second side of the redistribution layer structure, and
wherein in a top view of the chip arrangement, at least one of the solder contacts is arranged outside an area that overlaps with the semiconductor chip; and
a thermally and electrically conductive material on a side of the chip arrangement facing away from the solder contacts,
wherein, in the top view of the chip arrangement, a contact area at which the thermally and electrically conductive material is in thermal contact with the chip arrangement is limited to the area that overlaps with the semiconductor chip.

25. The circuit arrangement as claimed in claim 24, further comprising:
metal parts that are opposite areas of the chip arrangement in which the semiconductor chip is not arranged, on the side facing away from the solder contacts.

26. The circuit arrangement as claimed in claim 25, wherein a distance of the metal parts from the chip arrangement is at least 1.5 mm.

27. The circuit arrangement as claimed in claim 23, further comprising:
a thermal interface that includes the thermally and electrically conductive material,
wherein the thermal interface has at least one radio-frequency (RF) absorption layer that is configured to absorb electromagnetic radiation at an operating frequency of the semiconductor chip.

* * * * *